United States Patent
Perner

(10) Patent No.: US 6,961,262 B2
(45) Date of Patent: Nov. 1, 2005

(54) MEMORY CELL ISOLATION

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/640,792

(22) Filed: Aug. 13, 2003

(65) Prior Publication Data

US 2004/0047180 A1    Mar. 11, 2004

Related U.S. Application Data

(62) Division of application No. 10/151,914, filed on May 22, 2002.

(51) Int. Cl.⁷ ............................................. G11C 11/00
(52) U.S. Cl. ...................... 365/158; 365/173; 365/175; 365/177; 365/179; 365/180; 365/55; 365/72; 365/213
(58) Field of Search ........................... 365/173, 72, 55, 365/158, 66, 180, 175, 177, 179, 213

(56) References Cited

U.S. PATENT DOCUMENTS

| | | | | |
|---|---|---|---|---|
| 3,638,203 A * | 1/1972 | Patel | ........................ | 365/180 |
| 3,664,893 A * | 5/1972 | Frazee | ........................ | 438/133 |
| 6,351,410 B1 * | 2/2002 | Nakao et al. | ............... | 365/171 |
| 6,504,752 B2 * | 1/2003 | Ito | ............................. | 365/158 |
| 6,590,803 B2 * | 7/2003 | Saito et al. | ................. | 365/158 |
| 6,618,295 B2 * | 9/2003 | Scheuerlein | ........... | 365/189.09 |
| 6,707,698 B2 * | 3/2004 | Fricke et al. | ............... | 365/105 |
| 6,717,845 B2 * | 4/2004 | Saito et al. | ................. | 365/173 |
| 6,724,652 B2 * | 4/2004 | Deak | ........................ | 365/158 |
| 6,731,535 B1 * | 5/2004 | Ooishi et al. | .............. | 365/171 |
| 6,741,495 B2 * | 5/2004 | Kunikiyo et al. | .......... | 365/158 |
| 6,768,685 B1 * | 7/2004 | Scheuerlein | ........... | 365/189.07 |
| 2001/0010938 A1 * | 8/2001 | Bronner et al. | ................ | 438/3 |
| 2002/0027803 A1 * | 3/2002 | Matsui | ....................... | 365/173 |
| 2002/0080641 A1 * | 6/2002 | Asao et al. | ................... | 365/63 |
| 2002/0089024 A1 * | 7/2002 | Iwata | ........................ | 257/421 |
| 2002/0141233 A1 * | 10/2002 | Hosotani et al. | ........... | 365/158 |
| 2003/0031067 A1 * | 2/2003 | Kleveland et al. | .......... | 365/200 |
| 2003/0137871 A1 * | 7/2003 | Farrar | ........................ | 365/171 |
| 2003/0179011 A1 * | 9/2003 | Goodbread et al. | ........... | 326/39 |
| 2003/0193053 A1 * | 10/2003 | Gilton | ........................ | 257/72 |
| 2003/0197984 A1 * | 10/2003 | Inomata et al. | ............ | 360/324.2 |
| 2003/0206465 A1 * | 11/2003 | Muller et al. | ................ | 365/200 |
| 2004/0124407 A1 * | 7/2004 | Kozicki et al. | ................ | 257/9 |

* cited by examiner

*Primary Examiner*—Hoai Ho
*Assistant Examiner*—Ly Duy Pham

(57) ABSTRACT

Device and method for memory cell isolation. The memory cell includes a resistive component, such as a magnetic random access memory (MRAM) cell, and an isolation component, such as a four-layer diode. The memory cell may be included in a memory array. The method includes rapidly applying a forward bias across the isolation element to activate the isolation element.

6 Claims, 6 Drawing Sheets

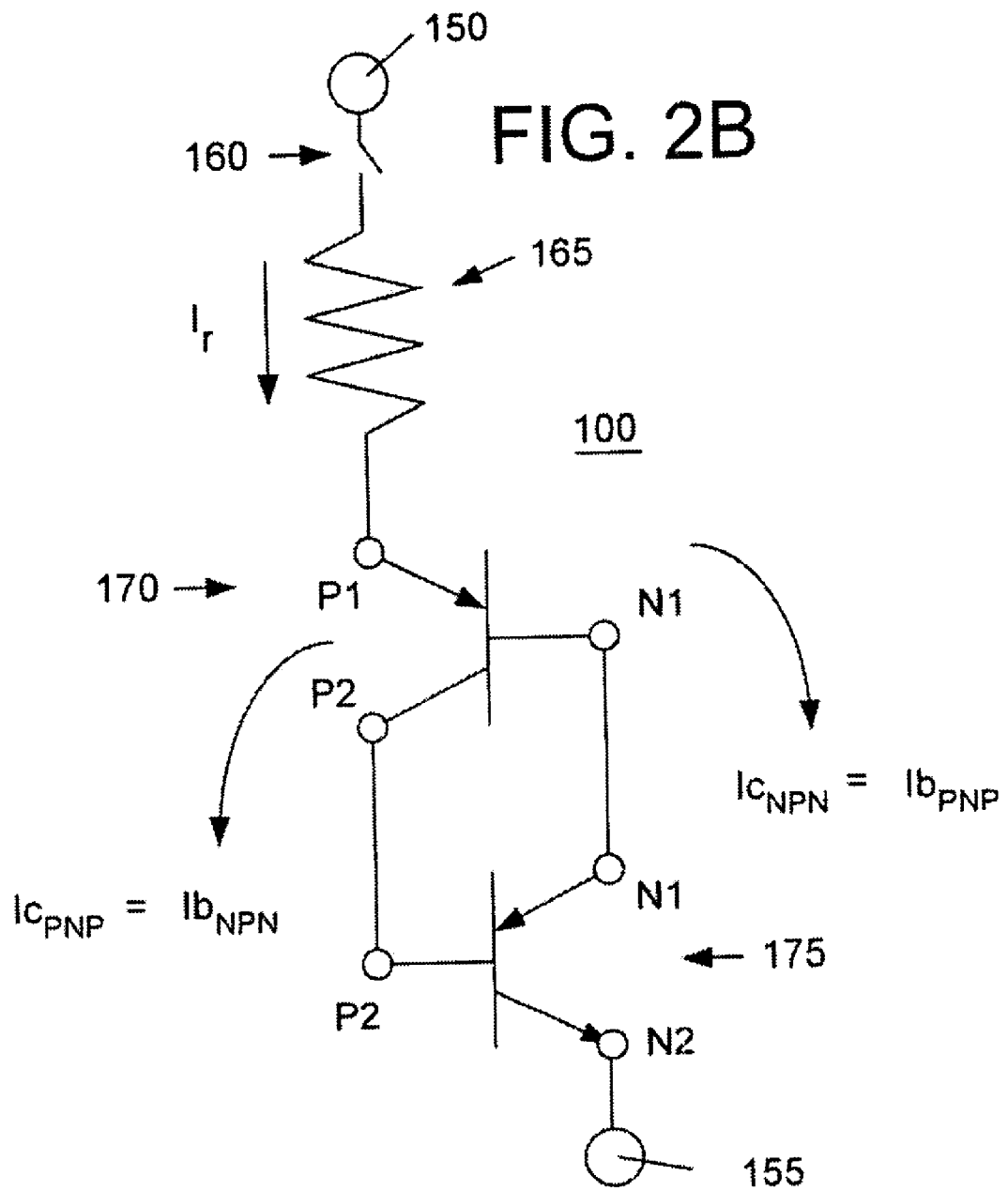

MEMORY CELL ISOLATION

CROSS-REFERENCES TO RELATED APPLICATIONS

This is a division of 10/151,914, filed May 22, 2002.

This application is related to U.S. Patent Application to Fred Perner et al., entitled "TRIPLE SAMPLE SENSING FOR MAGNETIC RANDOM ACCESS MEMORY (MRAM) WITH SERIES DIODES" (Ser. No. 10/151,915), filed on same date herewith, and to U.S. Patent Application to Fred Perner et al., entitled "EQUI-POTENTIAL SENSING MAGNETIC RANDOM ACCESS MEMORY (MRAM) WITH SERIES DIODE" (Ser. No. 10/151,913), also filed on same date herewith. These applications are incorporated herein in their entirety by reference.

BACKGROUND

FIG. 1A illustrates a non-volatile resistive memory cell according to the related art. The memory cell illustrated in FIG. 1A includes a magnetic random access memory (MRAM) cell 10 that is made up of a hard ferromagnetic layer 15 that has a fixed magnetic orientation, a tunneling barrier layer 20, and a soft ferromagnetic layer 25. The magnetic orientation of the soft ferromagnetic layer 25 may be switched between a direction parallel to the magnetic orientation of the hard ferromagnetic layer 15 (the parallel state) and a direction anti-parallel with the magnetic orientation of the hard ferromagnetic layer 15 (the anti-parallel state).

The effective resistance of the MRAM cell 10 (i.e. the amount of current allowed to pass through the tunneling barrier layer 20) depends upon whether the MRAM cell 10 is in the parallel or the anti-parallel state. Further, when a voltage is applied across the MRAM cell 10, an MRAM cell 10 in either a high or a low effective resistance allows for either a high or a low amount of current to flow through the MRAM cell 10. Hence, the high and low effective resistances can represent a "1" and a "0" data bit, respectively, and these data bits may be read from the MRAM cell 10 by monitoring the amount of current that passes through the MRAM cell 10.

In FIG. 1A, a two-layer diode 30 is electrically connected to the MRAM cell 10 and both the two-layer diode 30 and the MRAM cell 10 are positioned between a first metal layer 35 and a second metal layer 40 The two-layer diode 30 includes a first p-doped semiconductor layer 45 and a first n-doped semiconductor layer 50. The two-layer diode 30 restricts current flow in one direction across the non-volatile resistive memory cell.

The solid curve shown in FIG. 1B illustrates the current that flows through the two-layer diode 30 as a variety of voltages are applied to the two-layer diode 30. At low voltages, and at voltages that place a reverse bias across the two-layer diode 30, little current flows through the two-layer diode 30. In contrast, when a forward bias is applied to and increased across the two-layer diode 30, the current flowing through the two-layer diode 30 also increases. Thus when the two-layer diode 30 is connected to an MRAM cell 10, a forward bias across the two-layer diode 30 allows current to flow through the MRAM cell 10. However, a reverse bias across the two-layer diode 30 passes less current and therefore electrically isolates the MRAM cell 10.

One disadvantage of using a two-layer diode 30 to electrically isolate an MRAM cell 10 is that the two-layer diode 30 nonetheless allows a significant amount of current to flow through the MRAM cell 10 when a reverse bias is applied. Another disadvantage is that a forward bias across the two-layer diode 30 allows current to increase relatively slowly as a function of added voltage.

A disadvantage of the device illustrated in FIG. 1A is the high voltage drop that occurs across the two-layer diode 30 when a forward biasing voltage is applied across the non-volatile resistive memory cell. Further, since both the forward bias voltage and the series resistance of the two-layer diode 30 are strong functions of current, there may be a wide range of two-layer diode 30 forward voltage drops caused as a wide range of forward currents are applied to the two-layer diode 30. Hence, it becomes difficult to deconvolute the voltage drop due to the presence of the two-layer diode 30 from the voltage drop due to the MRAM cell 10 and data bits are not read as easily.

In addition, the two-layer diode 30 illustrated in FIG. 1A is typically a thin-film diode and therefore may leak a substantial amount of current. This phenomenon is partially illustrated in the lower, left quadrant of the graph in FIG. 1B, where reverse biasing across the two-layer diode 30 nonetheless allows some current flow. When many devices such as the device illustrated in FIG. 1A are electrically connected together in an array, diode leakage currents from many other devices in the array (that are electrically connected in parallel with the selected device) limit the signal resolution and increase noise when detecting data stored on the selected device.

SUMMARY

A memory cell that includes an isolation element and a resistive component electrically connected to the isolation element. The isolation element includes a first layer doped with a first type of charge, a second layer positioned adjacent to the first layer and doped with a second type of charge, a third layer positioned adjacent to the second layer and doped with the first type of charge, and a fourth layer positioned adjacent to the third layer and doped with the second type of charge.

A memory array that includes a plurality of bit lines, a plurality of word lines intersecting the plurality of bit lines at a plurality of cross points, and a plurality of memory cells. A memory cell in the plurality of memory cells may be located at a cross point of a first word line and a first bit line. The memory cell may include an isolation element and a resistive component electrically connected to the isolation element. The isolation element may include a first layer doped with a first type of charge, a second layer positioned adjacent to the first layer and doped with a second type of charge, a third layer positioned adjacent to the second layer and doped with the first type of charge, and a fourth layer positioned adjacent to the third layer and doped with the second type of charge.

A method of operating a data storage device. The device may include word lines, bit lines, and a memory array of memory cells, the memory cells being located at cross points of word lines and bit lines. The method may include the step of selecting a memory cell wherein the memory cell includes an isolation element and a resistive component. The method may also include activating the isolation element by rapidly applying a forward bias across the isolation element, and causing a current to flow through the selected memory cell.

DESCRIPTION OF THE DRAWINGS

Data storage devices and methods will be described, by way of example, in the description of exemplary embodiments, with particular reference to the accompanying drawings in which:

FIG. 2B illustrates an equivalent schematic of the device illustrated in FIG. 2A;

DETAILED DESCRIPTION

Figure 2A:
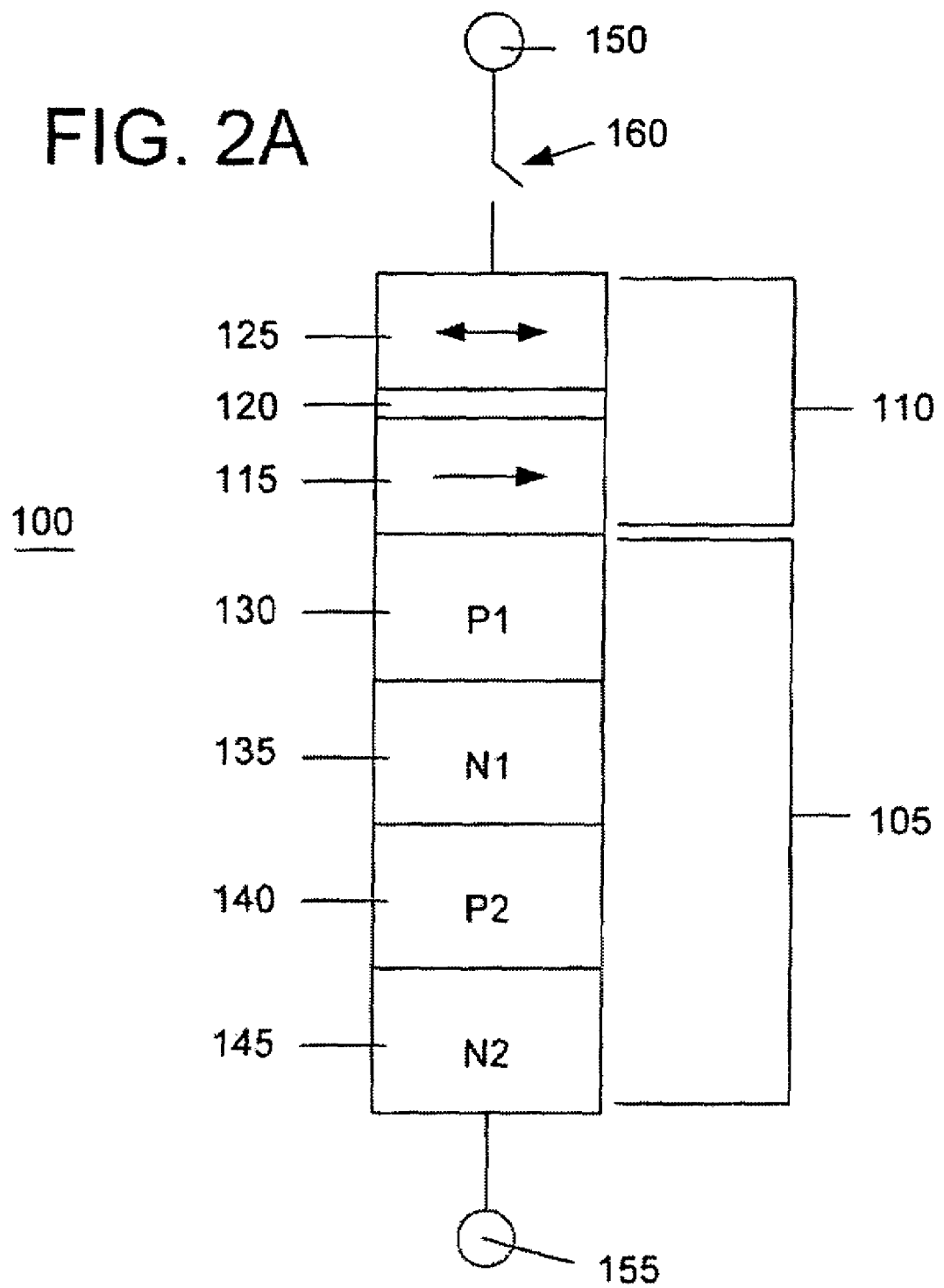
FIG. 2A illustrates one embodiment of an isolation element in the form of a four-layer diode electrically connected to a resistive component in the form of a MRAM cell.

FIG. 2A illustrates a resistive memory cell 100 that includes a four-layer diode 105 (also known as a Shockley diode) that is electrically connected to and that acts as an isolation element for a resistive component. In FIG. 2A, the resistive component is shown as a magnetic tunneling junction (MTJ) magnetic random access memory (MRAM) cell 110. However, other suitable resistive components include memory cells that are responsive to read and write currents or voltages. For example, giant magnetoresistance (GMR) devices and pseudo-spin valve (PSV) devices may be used.

The MRAM cell 110 illustrated in FIG. 2A includes a hard ferromagnetic layer 115 that has a fixed magnetic orientation, a tunneling barrier layer 120, and a soft ferromagnetic layer 125. Dependent on whether the magnetic orientations of the hard ferromagnetic layer 115 and soft ferromagnetic layer 125 are parallel or anti-parallel to each other, different amounts of current may travel trough the tunneling barrier layer 120. Hence, the MRAM cell 110 will effectively be more resistive when the magnetic orientations are anti-parallel and the two resistive states of the MRAM cell 110 can be used to store "0" and "1" data bits.

The resistive component (e.g. the MRAM cell 110) may be connected in series with the four-layer diode 105. The four-layer diode 105 illustrated includes a first layer (shown as a first p-doped semiconductor layer 130), a second layer (shown as a first n-doped semiconductor layer 135), a third layer (shown as a second p-doped semiconductor layer 140), and a fourth layer (shown as a second n-doped semiconductor layer 145). The four-layer diode 105 may act as an isolation element. In other words, the four-layer diode 105 may hinder or stops the flow of current from the first metal layer 150 to the second metal layer 155, and across the resistive memory cell 100, when the four-layer diode 105 is not activated. This hindrance or stoppage of current flow isolates the resistive memory cell 100 from other electrical components to which the resistive memory cell 100 may be electrically connected.

Although the first layer and the third layer are illustrated in FIG. 2A as being p-doped layers 130, 140 while the second layer and the fourth layer are illustrated as n-doped layers 135, 145, other layer configurations may be used. For example, the first and third layers may be n-doped and the second and fourth layers may be p-doped.

The resistive memory cell 100 configuration illustrated in FIG. 2A has an electrical switch 160 connected thereto. The switch 160 may be positioned at any location between the first metal layer 150 and the second metal layer 155. When in a closed position, the switch 160 allows a biasing voltage to be applied across the resistive memory cell 100 by the metal layers 150, 155. When in the open position, the switch 160 breaks the electrical connection between the resistive memory cell 100 and the metal layers 150, 155 such that no biasing voltage is applied.

FIG. 2B illustrates an equivalent schematic of the resistive memory cell 100 illustrated in FIG. 2A. The resistive component, illustrated as a MRAM cell 110 in FIG. 2A, is illustrated as a resistor 165 in FIG. 2B. The four-layer diode 105 is represented by an equivalent schematic that includes two transistors 170, 175 that are electrically interconnected to each other. The first n-doped semiconductor layer 135 of the four-layer diode 105 makes up the base of the PNP transistor 170 and the collector of the NPN transistor 175. The second p-doped semiconductor layer 140 makes up the collector of the PNP transistor 170 and the base of the NPN transistor 175.

When the four-layer diode 105 is "activated", the base current of the PNP transistor 170 ($Ib_{PNP}$) is equal to the collector current of the NPN transistor 175 ($Ic_{NPN}$) and the base current of the NPN transistor 175 ($Ib_{NPN}$) is equal to the collector current of the PNP transistor 170 ($Ic_{PNP}$). In order to "activate" the four-layer diode 105 so that current is allowed to flow across the four-layer diode 105, a forward biasing voltage may be rapidly applied across the four-layer diode 105. The maximum time period over which a forward biasing voltage may be applied to activate the four-layer diode 105 is dictated by the materials, geometry, etc., of the diode 105. However, the rate at which the voltage is increased should be large enough to allow inherent junction capacitances within the transistors 170, 175 to draw enough current over the time period to activate the transistor pair 170, 175.

In the case of FIG. 2B, the electrical switch 160 is drawn in the open position. However, the open position is only drawn for the purposes of clarity. Generally, the currents that flow through the resistive component (Ir) and four-layer diode 105 ($Ic_{PNP}$, $Ib_{PNP}$, $Ic_{NPN}$, $Ib_{NPN}$) flow either when the electrical switch 160 is in the closed position or when the electrical switch 160 has just been opened.

Figure 3:
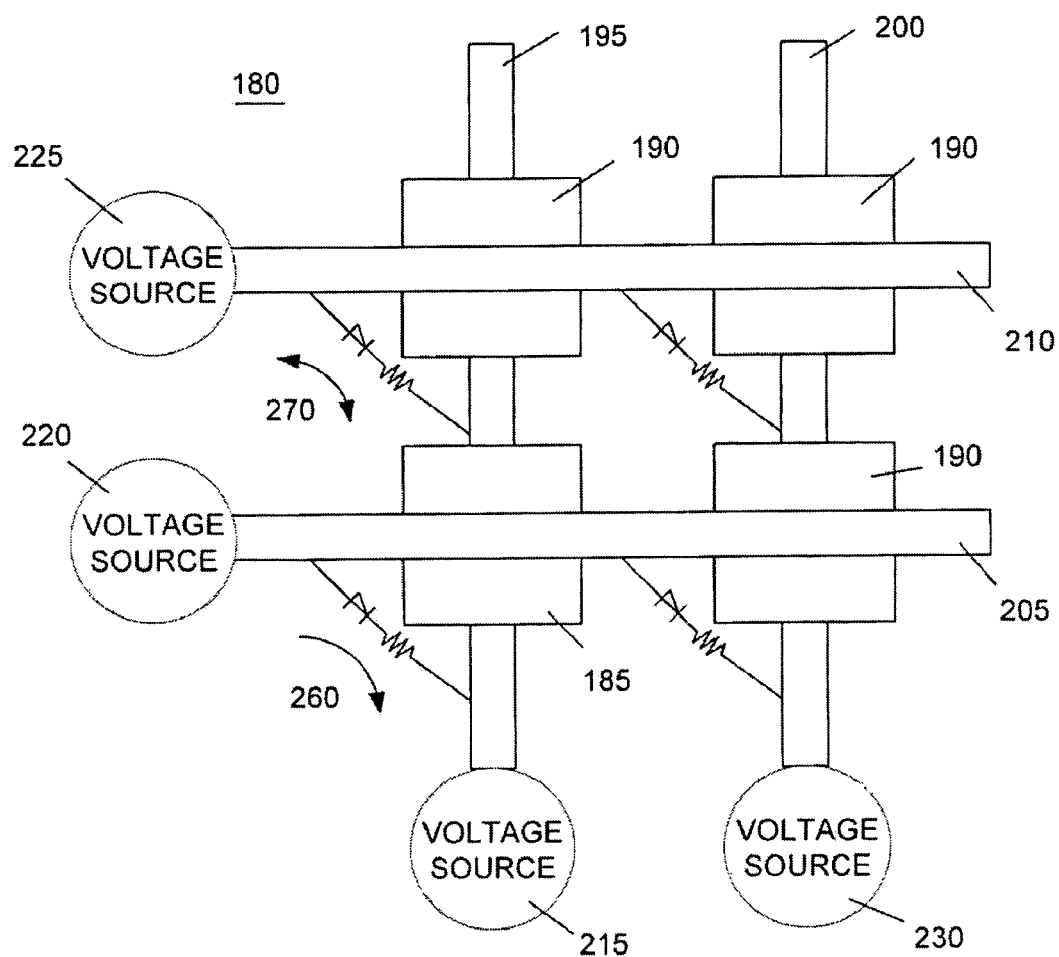
FIG. 3 illustrates an array of resistive memory cells that are electrically connected to each other and that include four-layer diodes.

FIG. 3 illustrates a 2×2 array 180 in which data may be stored. The array 180 includes a number of resistive memory cells such as the one illustrated in FIG. 2A. The array 180 in FIG. 3 contains one selected resistive memory cell 185 (at the bottom, left corner of the array 180) and three unselected resistive memory cells 190. The selected memory cell 185 is the cell that, at a chosen time, either has data being written to it or read from it. The unselected resistive memory cells 190, at the same chosen time, are neither being written to nor read from. Although the array 180 in FIG. 3 includes only three unselected resistive memory cells 190 and only one selected resistive memory cell 185, any number of cells 185, 190 may be included in the array 180.

In order to store data in a cell 185, 190, the direction of the magnetization of the soft ferromagnetic layers 125 may be varied to be parallel or anti-parallel to the magnetization of the hard ferromagnetic layers 115. This varies the effect of the resistive components in the cells 185, 190. For example, when a MRAM cell 110 is used, a "0" data bit may be stored when the MRAM cell 110 is in a parallel orientation and a "1" data bit may be stored when the MRAM cell 110 is in an anti-parallel orientation.

Also illustrated in FIG. 3 are a plurality of bit lines 195, 200 and a plurality of word lines 205, 210 that interest the plurality of bit lines 195, 200. The locations of the intersections may be referred to as "cross points" and it is at these cross points where the memory cells 185, 190 are located. The selected resistive memory cell 185 is electrically connected to the selected word line 205 illustrated horizontally in FIG. 3 and to the selected bit line 195 that is illustrated vertically in FIG. 3. These lines 195, 205 act analogously to the metal layers 150, 155 illustrated in FIG. 2A and may supply voltage and/or current to the selected resistive memory cell 185.

The bottom, right unselected resistive memory cell 190 represents one or more unselected resistive memory cells 190 that are electrically connected to the selected word line 205 but from which data is not immediately being read. The upper, left unselected resistive memory cell 190 represents one or more unselected resistive memory cells 190 that are electrically connected to the selected bit line 195 but from which data is not immediately being read. The top right unselected resistive memory cell 190 represents one or more unselected memory cells 190 that are neither electrically connected to the selected word line 205 nor to the selected bit line 195 and from which data is not immediately being read. Although the lines 195, 200, 205, 210 illustrated in FIG. 3 are parallel and perpendicular to each other, other configurations may be used in the array 180.

Four voltage sources 215, 220, 225, 230 are illustrated in FIG. 3. These voltage sources are each electrically connected to either one selected line 195, 205 or one unselected line 200, 210 and can apply a voltage or a ground to the line to which they are connected. When more than four resistive memory cells 185, 190 are in the array 180, more lines and voltage sources may be added.

Also illustrated in FIG. 3 are schematic symbols representing the resistive memory cells 100 that may be included in the array 180. The elements represented by the schematic symbols may be implemented with conventional circuit components, as illustrated, or with any type of circuit components configured to perform the same or equivalent functions. Although all of the equivalent schematic representations include only a four-layer diode 105 and a resistor that represents the resistive components of the resistive memory cells 100, other device combinations may be included in an array 180.

Figure 4:
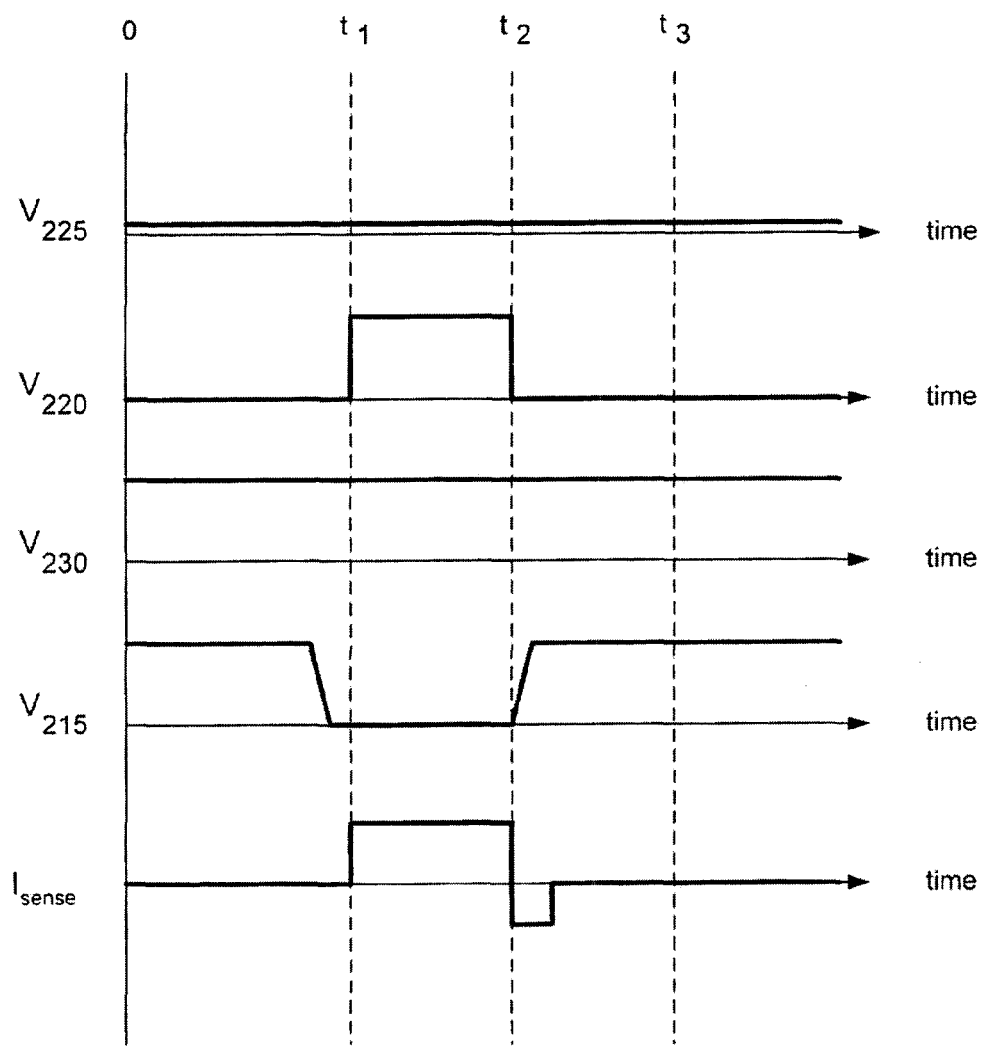
FIG. 4 illustrates current response characteristics of a selected resistive memory cell when a variety of voltages are applied to the array illustrated in FIG. 3.

FIG. 4 illustrates the current response characteristics of a selected resistive memory cell 185, such as the one illustrated in FIG. 2A, when a variety of voltages are applied to the array 180 illustrated in FIG. 3. The voltage levels shown in FIG. 4 may be applied to the array 180 in order to read data from the selected resistive memory cell 185. At the top of FIG. 4 is a voltage versus time graph of the voltage ($V_{225}$) that may be applied to the unselected word line 210 by the voltage source 225 over a selected time period. The voltage shown in FIG. 4 for voltage source 225 is a relatively low voltage and is substantially constant over the selected time period shown.

The second graph from the top of FIG. 4 is a voltage versus time graph that shows the voltage ($V_{220}$) that may be applied by the voltage source 220 to the selected word line 205 to which it is electrically connected. Initially, at time zero, the voltage is substantially zero. Then, at time $t_1$, the voltage rapidly increases to a relatively high voltage and remains at that high voltage until time $t_2$ when the voltage rapidly decreases to a substantially zero level. This substantially zero voltage remains until the end of the time illustrated in FIG. 4.

The middle graph illustrated in FIG. 4 is a voltage versus time graph that shows the voltage ($V_{230}$) applied by the voltage source 230 that is electrically connected to the unselected bit line 200. This voltage is kept at a substantially constant and relatively high level throughout the time period illustrated in FIG. 4.

The second graph from the bottom of FIG. 4 illustrates the voltage ($V_{215}$) applied to the array 180 by the voltage source 215 that is electrically connected to the selected bit line 195. This voltage starts at a relatively high level. Then, shortly before time $t_1$, the voltage rapidly drops to a substantially zero level. The voltage remains at the substantially zero level until time $t_2$, at which time it rapidly rises to the relatively high voltage level shown. The voltage then remains at the relatively high level for the remainder of the time illustrated in FIG. 4.

When all of the voltages illustrated in FIG. 4 are applied simultaneously, as shown, to the array 180 illustrated in FIG. 3, the current ($I_{sense}$) that develops and flows through the selected resistive memory cell 185 is shown in the bottom graph of FIG. 4 as a function of time. From time zero (at the left of the graph) until time ti, the four-layer diode 105 (the isolation element) in the selected resistive memory cell 185 is de-activated and substantially no current flows through the selected resistive memory cell 185. However, at time $t_1$, a forward bias is rapidly applied across the selected resistive memory cell 185 as the voltage sources 215, 220 that are electrically connected to the selected bit line 195 and the selected word line 205, respectively, are rapidly switched or toggled between a low or substantially zero voltage and a relatively high voltage. This sudden forward bias "activates" or "turns on" the four-layer diode 105 in the selected resistive memory cell 185 and allows current to flow.

At time $t_2$, the voltage sources 215, 220 that were toggled at, or shortly prior to, time $t_1$ are again toggled, but this time produce a reverse bias across the selected resistive memory cell 185. In response, the four-layer diode 105 in the selected resistive memory cell 185 allows a brief, negative current to flow through the selected resistive memory cell 185. Then, the four-layer diode 105 or isolation element de-activates and a current of substantially zero value is attained.

As mentioned above, the array 180 illustrated in FIG. 3 may be used to store data bits in the resistive components or MRAM cells 110 of the resistive memory cells 185, 190. Binary data bits may be stored by having the MRAM cells 110 be in either a state of high resistance or low resistance, as defined by the amount of current that may flow through the MRAM cell 110 when the soft ferromagnetic layer 125 is either in the parallel or anti-parallel orientation relative to the magnetic orientation of the hard ferromagnetic layer 115. A method for determining whether the MRAM cell 110 in the selected resistive memory cell 185 is in a state of high or low resistance includes monitoring the amount of current that flows through the selected resistive memory cell 185 when the four-layer diode 105 is activated.

Because the four-layer diode 105 must generally be activated before any sense current ($I_{sense}$) flows through the selected resistive memory cell 185, the configuration of the resistive memory cell shown in FIG. 2A, when used in an array 180, may be used to select isolated cells in the array 180 to read. For example, since only under specific voltage-application sequences will a substantial amount of current be allowed to flow through the selected resistive memory cell 185, unwanted currents (e.g. current 270) that ordinarily would flow through unselected memory cells 190 will not flow and, therefore, will not mix or interfere with the signal current 260 that flows through the selected resistive memory cell 185.

Further, even if a minor amount of unwanted current does leak through any of the unselected resistive memory cells, setting the voltage across the unselected word line 210 to be equal to or higher than the voltage across the selected bit line 195 will substantially eliminate currents flowing through the unselected memory cells 190 that are along the unselected word line 210.

Figure 1A:
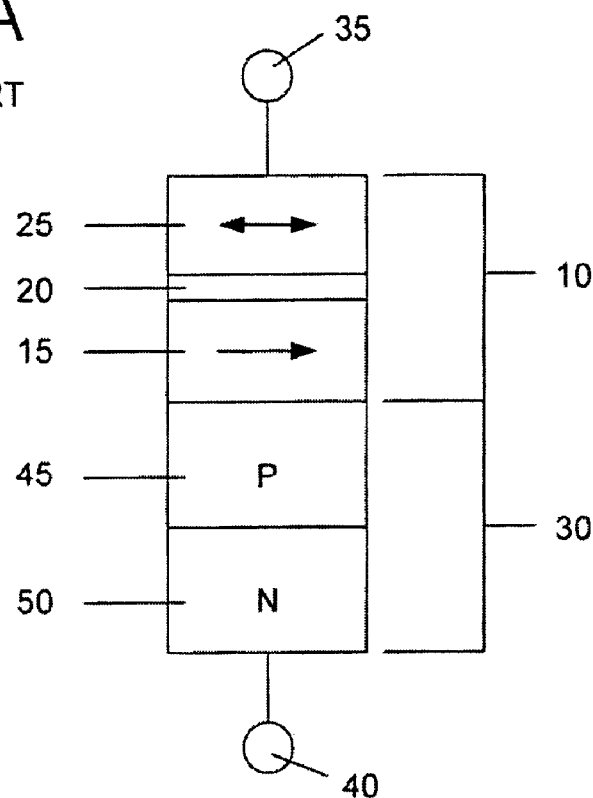
FIG. 1A illustrates a MRAM cell and a two-layer diode that are electrically connected together according to the related art.
Figure 1B:
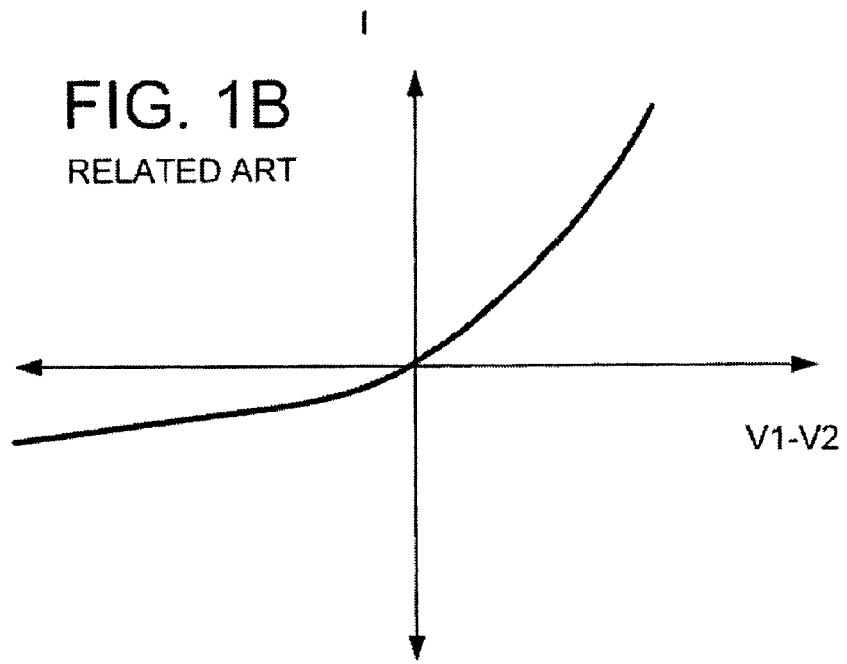
FIG. 1B illustrates the current response characteristics of the diode of FIG. 1A when different voltages are applied.

Among the advantages of the array 180 illustrated in FIG. 3 is the fact that unwanted currents 270 are minimized and that the sense or signal current 260 flowing through a selected resistive memory cell 185 may be turned on or off more distinctly and/or over relatively short time periods when compared to the time periods required to turn the two-layer diode 30 of FIG. 1A on or off. A four-layer diode allows less negative current to flow under a backward voltage bias than does a two-layer diode. Also, the amount of current allowed to pass through a four-layer diode rises more sharply as a function of forward voltage bias applied than in a two-layer diode. Hence, when using a four-layer diode 105, it becomes easier to isolate the selected resistive memory cell 185 and to detect whether the cell 185 is in a state of high or low resistance. It is also, therefore, easier to determine whether the selected resistive memory cell 185 contains a "0" or "1" data bit.

Figure 5:
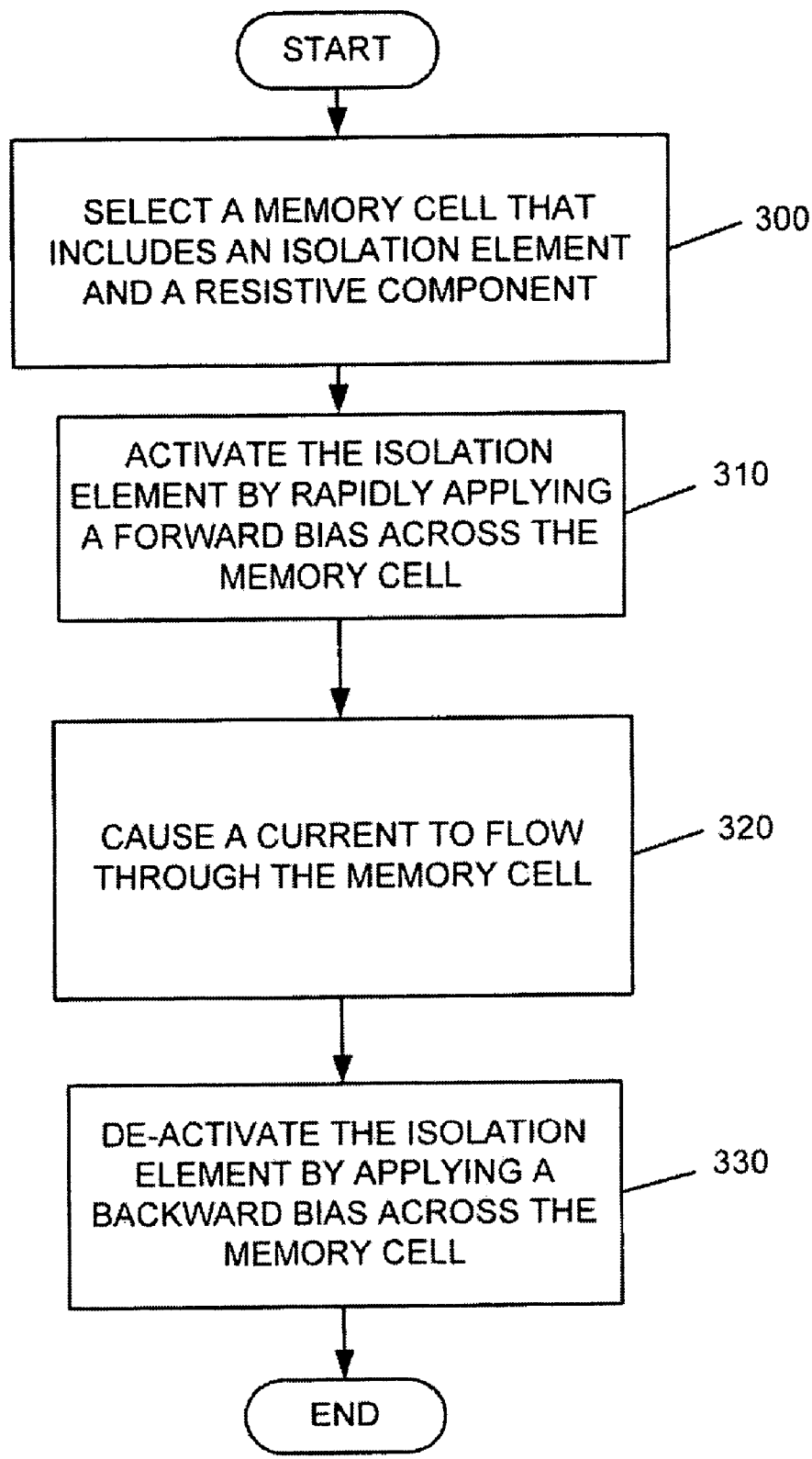
FIG. 5 is a flowchart illustrating the steps of a method for sensing a data bit.

FIG. 5 illustrates the steps of a method of operating a data storage device that includes a memory array of memory cells such as is illustrated in FIG. 3 In the array, the memory cells may be located at the cross points of word lines and bit lines. The method can be used to sense the value of a data bit stored in a memory cell.

In step 300, a memory cell that includes an isolation element and a resistive component is selected. The memory cell may be selected to include a four-layer diode as the isolation element and/or may be selected to include a MRAM cell as the resistive component.

In step 310, the isolation element is activated by rapidly applying a forward bias across the memory cell. Especially when the isolation element is a four-layer diode, this step may activate the four-layer diode and allow for current to flow through the memory cell.

In step 320, a current is caused to flow through the memory cell. This current may be monitored and used to determine the type of data bit that is stored in the memory cell. For example, if the resistive component is in a state of high resistance (e.g. if the resistive component is a MRAM cell in the anti-parallel state), a "1" value may be stored in the memory cell and monitoring the amount of current flowing through the memory cell can be used to read the "1" value.

In step 330, the isolation element is de-activated by applying a backward bias across the memory cell. This stops current from flowing across the memory cell. As an alternative to step 330, the isolation element may be de-activated by operating an electrical switch to open a circuit that supplies the forward bias across the isolation element.

In addition to the steps 300, 310, 320, 330 discussed above and illustrated in FIG. 5, several other steps may be included in the method. For example, the method may include the step of applying a substantially steady and relatively low first voltage and a substantially steady and relatively high second voltage to the memory array. The application of such voltages can reduce the amount of unwanted currents flowing in the array.

In another step that may be included in the method, a fluctuating third voltage and a fluctuating fourth voltage may be applied to the array. When the third and fourth voltages are used, step 310, in which the isolation element is activated, may be performed by switching the third voltage from a relatively low voltage to a relatively high voltage and by switching the fourth voltage from a relatively high voltage to a relatively low voltage. These switches may be performed substantially simultaneously in order to activate a four-layer diode isolation element. The isolation element may then be de-activated by switching the third voltage from a relatively high voltage to a relatively low voltage and by switching the fourth voltage from a relatively low voltage to a relatively high voltage.

The forgoing detailed description has been given for understanding exemplary implementations of data storage devices and methods for using data storage devices. No unnecessary limitations should be understood therefrom, as modifications will be obvious to those skilled in the art without departing from the scope of the appended claims and their equivalents.

What is claimed is:

1. A method of operating a data storage device comprising a memory array of memory cells, the memory cells being located at cross points of word lines and bit lines, the method comprising:
   selecting a memory cell that includes an isolation element and a resistive component, the resistive component having a state;
   activating the isolation element by rapidly applying and fluctuating a forward bias across the isolation element; and
   causing a current to flow through the selected memory cell in order to determine the state of the resistive component.

2. The method of claim 1, wherein the selecting step comprises selecting the memory cell to include a four-layer diode as the isolation element.

3. The method of claim 1, wherein the selecting step comprises selecting the memory cell to include a magnetic random access memory (MRAM) cell as the resistive component.

4. The method of claim 1, further comprising de-activating the isolation element by applying a backward bias across the isolation element.

5. The method of claim 1, further comprising de-activating the isolation element by operating an electrical switch to open a circuit that supplies the forward bias across the isolation element.

6. The method of claim 1, further comprising de-activating the isolating element by applying a fluctuating backward bias across the isolation element.

* * * * *